(12) United States Patent
Park (10) Patent No.: US 9,672,914 B1
(45) Date of Patent: Jun. 6, 2017

(54) SEMICONDUCTOR MEMORY DEVICE AND OPERATING METHOD THEREOF

(71) Applicant: SK hynix Inc., Icheon-si, Gyeonggi-do (KR)

(72) Inventor: Eun Young Park, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/174,398

(22) Filed: Jun. 6, 2016

(30) Foreign Application Priority Data

Jan. 7, 2016 (KR) .......................... 10-2016-0002190

(51) Int. Cl.
*G11C 11/34* (2006.01)
*G11C 16/04* (2006.01)
*G11C 16/34* (2006.01)

(52) U.S. Cl.
CPC .......... *G11C 16/04* (2013.01); *G11C 16/3459* (2013.01)

(58) Field of Classification Search
CPC ............................. G11C 16/04; G11C 16/3459
USPC ........................................ 365/185.22, 185.14
See application file for complete search history.

(56) References Cited

U.S. PATENT DOCUMENTS

| | | | |
|---|---|---|---|
| 5,687,121 A * | 11/1997 | Lee ...................... | G11C 11/5621 365/185.11 |
| 2005/0276108 A1* | 12/2005 | Guterman .............. | G11C 16/10 365/185.18 |
| 2010/0182818 A1* | 7/2010 | Ito .......................... | G11C 17/18 365/96 |
| 2011/0122697 A1* | 5/2011 | Jang .................... | G11C 16/3418 365/185.12 |

FOREIGN PATENT DOCUMENTS

| | | |
|---|---|---|
| KR | 100806119 B1 | 2/2008 |
| KR | 1020110137192 A | 12/2011 |

* cited by examiner

*Primary Examiner* — Anthan Tran
(74) *Attorney, Agent, or Firm* — William Park & Associates Ltd.

(57) ABSTRACT

Provided herein are a semiconductor memory device and an operating method thereof. The semiconductor memory device may include a memory cell array, peripheral circuits, and a control logic. The memory cell array may include a plurality of memory strings. The peripheral circuits may program the memory cell array. The control logic may control the peripheral circuits and execute instructions for performing a first program operation by applying a program voltage to at least two selected word lines, among a plurality of word lines of the memory cell array, at a same time, and, after the first program operation, performing a second program operation by applying the program voltage to each of the selected word lines one at a time.

20 Claims, 8 Drawing Sheets

SEMICONDUCTOR MEMORY DEVICE AND OPERATING METHOD THEREOF

CROSS-REFERENCE TO RELATED APPLICATION

The present application claims priority to Korean patent application number 10-2016-0002190 filed on Jan. 7, 2016, the entire disclosure of which is incorporated herein by reference.

BACKGROUND

1. Technical Field

Various embodiments of the present disclosure relate to an electronic device, and more particularly to a semiconductor memory device and an operating method thereof.

2. Related Art

A semiconductor memory device is one of the examples of semiconductor devices. The semiconductor memory devices may be classified into volatile memory devices and nonvolatile memory devices.

The nonvolatile memory device can retain its data even in the absence of a power source, although it may have a slow read and write speed. The nonvolatile memory device may be used for the task of secondary storage, which does not lose the data when the device is powered down. Examples of the nonvolatile memory device may include a read-only memory (ROM), a mask ROM (MROM), a programmable ROM (PROM), an erasable programmable ROM (EPROM), an electrically erasable programmable ROM (EEPROM), a flash memory, phase-change random access memory (PRAM), a magnetic RAM (MRAM), a resistive RAM (RRAM), a ferroelectric RAM (FRAM), etc. The flash memory may be classified into a NOR type and a NAND type.

Like a random access memory (RAM), the flash memory can be written and erased multiple times, and like the ROM, the flash memory can retain its data even when power is interrupted. Recently, the flash memory is widely used as a storage medium of portable electronic devices such as a digital camera, a smartphone, a personal digital assistant (PDA) and MP3.

SUMMARY

In an embodiment of the present disclosure, a semiconductor memory device may include a memory cell array, peripheral circuits, and a control logic. The memory cell array may include a plurality of memory strings. The peripheral circuits may program the memory cell array. The control logic may control the peripheral circuits and execute instructions for performing a first program operation by applying a program voltage to at least two selected word lines, among a plurality of word lines of the memory cell array, at a same time, and, after the first program operation, performing a second program operation by applying the program voltage to each of the selected word lines one at a time.

In an embodiment of the present disclosure, a semiconductor memory device may include a memory cell array, peripheral circuits, and a control logic. The memory cell array may include a plurality of memory strings. The peripheral circuits may program the memory cell array. The control logic may control the peripheral circuits so as to perform a first program operation by applying a program voltage to at least two selected word lines, among a plurality of word lines of the memory cell array, at a same time, and, after the first program operation, perform a second program operation by applying the program voltage to each of the selected word lines one at a time. The peripheral circuits may be controlled such that a start program voltage of the second program operation is set using a last program voltage of the first program operation.

In an embodiment of the present disclosure, a method of operating a semiconductor memory device may include storing a plurality of data bits in page buffers coupled to a memory cell array through bit lines, the memory cell array including a plurality of memory strings, adjusting a potential level of the bit lines depending on the plurality of data bits, performing a first program operation by simultaneously applying a program voltage to at least two selected word lines of a plurality of word lines of the memory cell array, and performing, after the first program operation, a second program operation by applying the program voltage to each of the selected word lines one at a time.

DETAILED DESCRIPTION

Advantages and features of the present disclosure, and methods for achieving the same will be cleared with reference to exemplary embodiments described later in detail together with the accompanying drawings. Accordingly, the present disclosure is not limited to the following embodiments but may be embodied in other types. Rather, these embodiments are provided so that the present disclosure will be thorough and complete, and will fully convey the technical spirit of the disclosure to those skilled in the art.

It will be understood that when an element is referred to as being "coupled" to another element, it may be directly coupled to the other element or intervening elements may be present therebteween. In the specification, when an element is referred to as "comprising" or "including" a component, it does not preclude another component but may further include other components unless the context clearly indicates otherwise.

Figure 1:
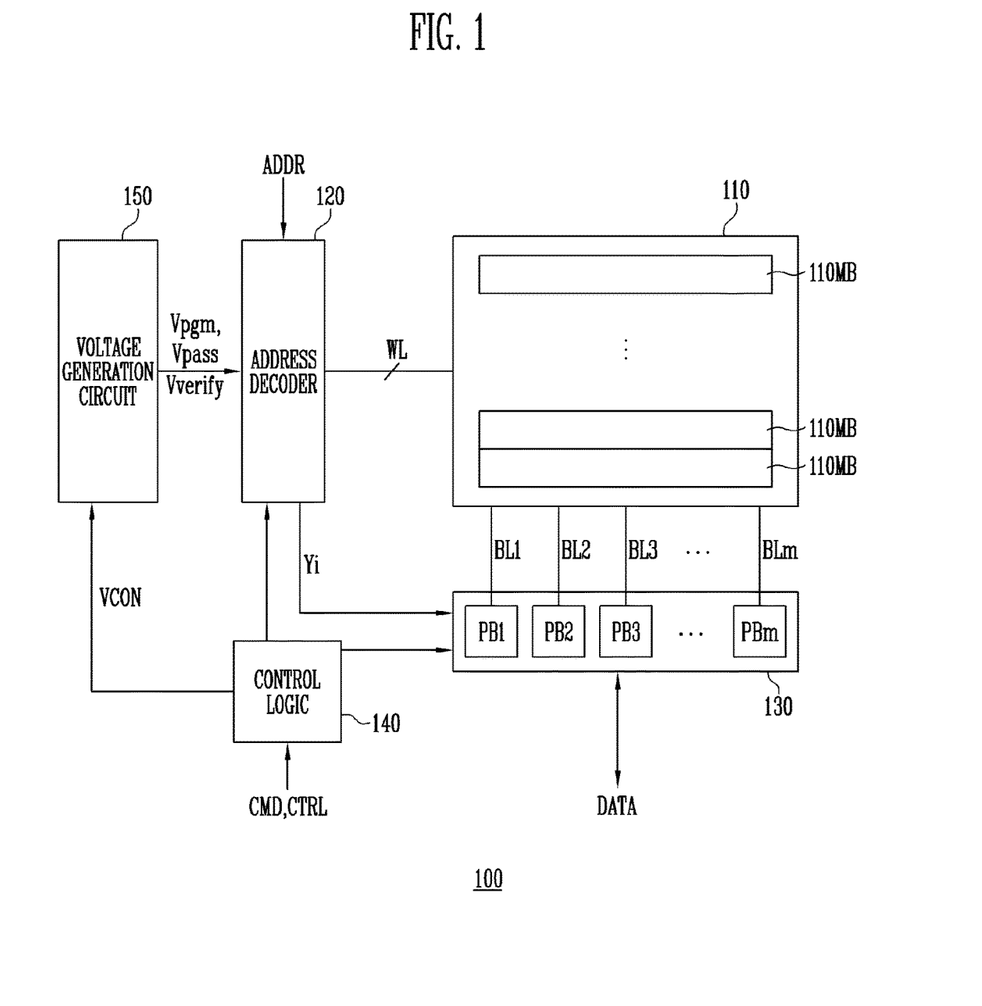
FIG. 1 is a diagram illustrating an example configuration of a semiconductor memory device according to an embodiment of the present disclosure.

FIG. 1 is a diagram illustrating an example configuration of a semiconductor memory device according to an embodiment of the present disclosure.

Referring to FIG. 1, a semiconductor memory device 100 may include a memory cell array 110, peripheral circuits 120, 130 and 150, and a control logic 140. The peripheral circuits 120, 130 and 150 may include an address decoder 120, a page buffer circuit 130 and a voltage generation circuit 150.

The memory cell array 110 may have a plurality of memory cells that are organized into a plurality of memory blocks 110MB. The plurality of memory cells belonging to a memory block 110MB may be organized into a page. The memory cell array 110 may be coupled to the address decoder 120 through a plurality of word lines WL. The memory cell array 110 may be coupled to the page buffer circuit 130 through bit lines BL1 to BLm. In an embodiment, the plurality of memory cells may be nonvolatile memory cells. In an embodiment, the memory cells coupled to the same word line may be defined as one page.

In an embodiment, the memory cells of the memory cell array 110 may be arranged in a plurality of memory strings. Each memory string may include a drain select transistor, a plurality of memory cells, and a source select transistor, which are coupled in series between a bit line and a source line.

The address decoder 120, the page buffer circuit 130, and the voltage generation circuit 150 may be used as peripheral circuits for driving the memory cell array 110.

The address decoder 120 may be coupled to the memory cell array 110 through the word lines WL. The address decoder 120 may operate under the control of the control logic 140. The address decoder 120 may receive addresses ADDR through an input/output buffer (not illustrated) provided in the semiconductor memory device 100.

The address decoder 120 may decode a row address of the received addresses ADDR. The address decoder 120 may apply, during a program operation, a program voltage Vpgm, a pass voltage Vpass, a verify voltage Vverify, and a plurality of operation voltages, which are generated from the voltage generation circuit 150, to the memory cells and the drain and source select transistors of the memory cell array 110 in accordance with the decoded row address.

The address decoder 120 may decode the addresses ADDR to extract column addresses. The address decoder 120 may transmit the decoded column address Yi to the page buffer circuit 130.

Addresses ADDR received in response to a request for a program operation may include a block address, a row address, and a column address Yi therein. The address decoder 120 may select one memory block according to the block address and the column address, and then may select more than one word line WL at once or select only one word line WL. The column address Yi is decoded by the address decoder 120 and provided to the page buffer circuit 130.

The page buffer circuit 130 may include a plurality of page buffers PB1 to PBm. The plurality of page buffers PB1 to PBm may be coupled to the memory cell array 110 through the bit lines BL1 to BLm. Each of the page buffers PB1 to PBm may temporarily store data DATA to be programmed during the program operation and control a bit line voltage of a corresponding one of the bit lines BL1 to BLm in accordance with the temporarily stored program data DATA. The page buffer circuit 130 may operate under the control of the control logic 140.

The control logic 140 may be coupled to the address decoder 120, the page buffer circuit 130, and the voltage generation circuit 150. In response to a command signal CMD and a control signal CTRL, the control logic 140 may provide a voltage control signal VCON for the voltage generation circuit 150 to generate operation voltages Vpgm, Vverify and Vpass.

In an embodiment, the control logic 140 may apply program voltages Vpgm in different manners depending on whether it is in a first program operation or a second program operation. During the first program operation, the control logic 140 may apply a program voltage Vpgm at the same time to at least two selected word lines coupled to the memory cell array 110 and control the peripheral circuits 120, 130 and 150 to perform the first program operation. The control logic 140 may perform the second program operation after performing the first program operation. In the second program operation, the control logic 140 may select one word line at a time. The control logic 140 may apply the program voltage Vpgm to one word line at a time, and may control the peripheral circuits 120, 130 and 150 to perform the second program operation. Each of the first and second program operations may be performed by an incremental step pulse program (ISPP) method in which the program voltage is controlled such that it gradually increases by a step voltage each time.

The voltage generation circuit 150 may generate, in response to a voltage control signal VCON outputted from the control logic 140, the operation voltages Vpgm, Vverify and Vpass that are used for the overall operations of the memory cells.

Figure 2:
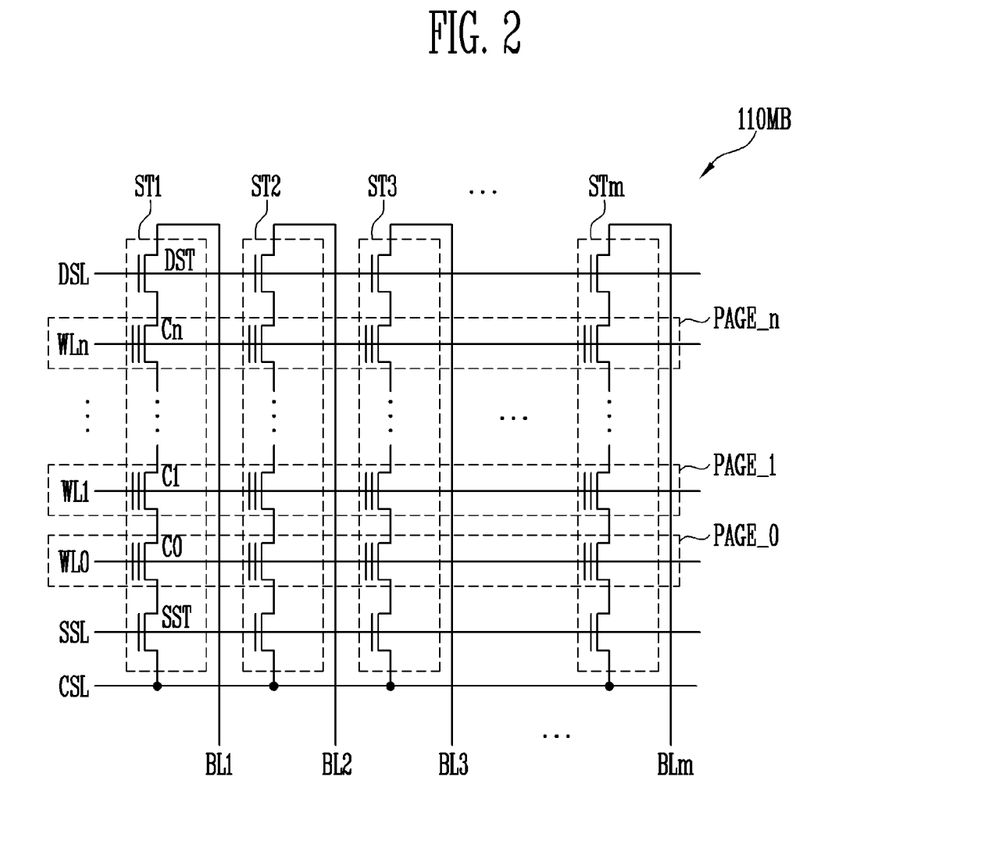
FIG. 2 is a diagram illustrating an example configuration of a memory block of FIG. 1.

FIG. 2 is a diagram illustrating an example configuration of a memory block of FIG. 1.

Referring to FIG. 2, one of the memory blocks of FIG. 1 will be discussed as an example.

Although the present embodiment performs the program operation in a manner that stores two bits of data in a unit cell, which may be called a multi level cell (MLC), the present disclosure is not limited thereto. For example, various embodiments of the present disclosure may be applied to other kinds of memory cells, such as a triple level cell (TLC), a quad level cell (QLC), etc., having various threshold voltage levels.

Referring to FIG. 2, the memory block 110MB may include a plurality of memory strings ST1 to STm, which are coupled between the bit lines BL1 to BLm and a common source line CSL. For instance, the bit lines BL1 to BLm may be respectively coupled to the plurality of memory strings ST1 to STm. The common source line CSL may be coupled in common to the plurality of memory strings ST1 to STm.

Hereinafter, a first memory string ST1, which is one of the memory strings ST1 to STm, will be described as an example.

The first memory string ST1 may include a source select transistor SST, a plurality of memory cells C0 to Cn, and a drain select transistor DST, which are coupled in series to each other between the common source line CSL and the first bit line BL1. Gates of the source select transistors SST coupled to the different memory strings ST1 to STm may be coupled to the source select line SSL. Gates of the memory cells C0 to Cn may be respectively coupled to the word lines WL0 to WLn. Gates of the drain select transistors DST may be coupled to the drain select line DSL.

The memory cells included in the memory block 110MB may be classified in a physical page unit or a logical page unit.

When the program operation is performed on the basis of the MLC, memory cell states that a single memory cell can have may be classified into an erase state, a PV1 state, a PV2 state, and a PV3 state. Here, the PV1, PV2, and PV3 states may be programmed threshold voltage distributions. For example, the PV1 state may be the lowest programmed threshold voltage distribution, and the PV3 state may be the highest programmed threshold voltage distribution. The PV2 state may be a programmed threshold voltage distribution between the PV1 and PV3.

Although the present embodiment selects a first word line WL0 and a second word line WL1 respectively corresponding to first and second pages PAGE_0 and PAGE_1 of the selected memory block 110MB of the memory cell array 110, the present disclosure is not limited thereto. Alternatively, two or more word lines among the plurality of word lines WL0 to WLn may be selected and used.

In an embodiment of the present disclosure, the first program operation is performed first, and then the second program operation is performed. In the first program operation, a program voltage Vpgm may be applied at the same time to at least two selected word lines among the word lines WL0 to WLn coupled to the plurality of memory cells. In the second program operation, a program voltage Vpgm may be applied to the selected word lines one at a time in a predetermined order. The first and second program operations may be performed using ISPP method, and thud the program voltage Vpgm may be increased stepwise.

For example, in the first program operation, a program operation may be performed by applying a program voltage Vpgm at the same time to the first memory cell C0 and the second memory cell C1, among the plurality of memory cells C0 to Cn included in the first memory string ST1. In this case, each of the first and second memory cells C0 and C1 may be programmed to one of the erase state, the PV1 state, the PV2 state, and the PV3 state. For example, when the first memory cell C0 is selected to be programmed into the PV1 state and the second memory cell C1 is selected to be programmed to the PV2 state, because the same program voltage Vpgm is applied to the first memory cell C0 and the second memory cell C1 at the same time, the first program operation may be performed such that the first and second memory cells are programmed to the PV1 state. For instance, ISSP-type program voltages Vpgm may be applied to the first word line W0 and the second word line W1 at the same time, and it is determined whether the first memory cell C0 selected to be programmed into the PV1 state has been programmed into the PV1 state by a program verification operation. If the first memory cell C0 has not been programmed, the program voltage Vpgm is increased by a step voltage and then applied to the first word line W0 and the second word line W1. If it is determined, as a result of the program verification, that the first memory cell C0 has been programmed into the PV1 state, the page buffer PB1 applies a program inhibit voltage to the first bit line BL1 of the first memory string ST1. The same program operation performed on the first memory cell C0 may be performed on the second memory cell C1 so that the second memory cell C1 may be programmed to have a similar threshold voltage distribution to the first memory cell C0. The threshold voltage distribution of the second memory cell C1 may be lower than the PV2 state to which the memory cell is finally programmed.

That is, when it is determined that one of at least two selected memory cells among the plurality of memory cells included in one memory string has been programmed, it is determined that the first program operation performed on the at least two selected memory cells has been completed, and then a program inhibit voltage is applied to the bit line of the corresponding memory string coupled to the at least two selected memory cells.

When, like the first program operation for the first memory string ST1 that has passed a program verification check, it is determined that the first program operation for all of the second to $m^{th}$ memory strings ST2 to STm has passed the program verification, and thus a program inhibit voltage is applied to all of the bit lines BL1 to BLm of the plurality of memory strings ST1 to Stm, and the first program operation is completed.

If the first program operation is completed, the second program operation is performed. The second program operation may be performed on the first and second pages PAGE_0 and PAGE_1, which were selected during the first program operation, page by page in a predetermined order. For example, a program operation for the first page PAGE_0 may be performed by applying a program voltage Vpgm that is increased stepwise (i.e., the ISPP), and if it is determined that the program verification for the first page PAGE_0 has passed, a program operation for the second page PAGE_1 is performed using the ISPP method.

Here, a start program voltage Pgm Start Bias of the first program operation and a start program voltage Pgm Start Bias of the second program operation may be set to be the same. Alternatively, the last program voltage Vpgm applied during the first program operation may be set to the first program voltage Vpgm of the second program operation.

For example, in the first program operation, if the first memory cell C0 has been programmed into the PV1 state (e.g., the first memory cell C0 has passed a program verification), and the second memory cell C1 has not been programmed into the PV2 state, the last program voltage Vpgm applied during the first program operation is applied to the second memory cell C1 as the first program voltage Vpgm of the second program operation. As a result, the threshold voltage of the second memory cell C2 may increase from the PV1 state to be programmed into the PV2 state during the second program operation. Here, because a start program voltage Vpgm of the second program operation may be set to be higher than a start program voltage Vpgm of the first program operation, the number of iterations of program pulse applications needed to complete the program operations may be reduced, and thus the time it takes to perform the program operation may be reduced.

Alternatively, a voltage level increased by a step voltage from the last program voltage Vpgm of the first program operation may be set as the start program voltage Vpgm of the second program operation.

As described above, in the case where the first program operation for at least two pages is performed at once and thereafter the second program operation of programming the selected pages is performed one at a time, the time it takes to perform the second program operation may be reduced, and thus the total time it takes to perform the first and second program operations may be reduced.

Figure 3:
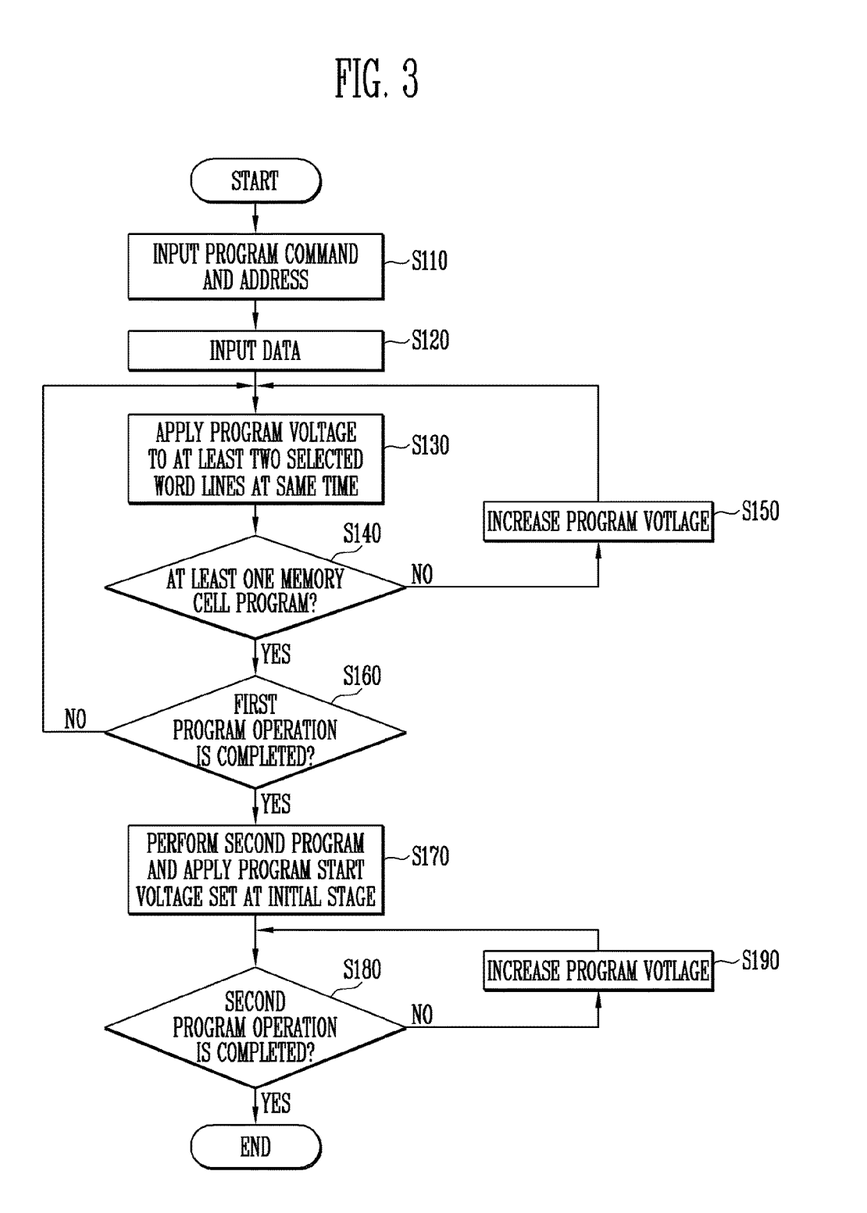
FIG. 3 is a flowchart illustrating an example of a program operation of the semiconductor memory device according to an embodiment of the present disclosure.

FIG. 3 is a flowchart illustrating an example of the program operation of the semiconductor memory device according to an embodiment of the present disclosure.

Referring to FIGS. 1, 2 and 3, a program command and address information may be input from an external device (at S110). A plurality of data bits DATA to be programmed may be input to page buffers PB1 to PBm of the page buffer circuit 130 (at S120). Depending on the data bits input to the page buffers PB1 to PBm, potential levels of the bit lines BL1 to BLm coupled to the memory cell array 110 may be controlled.

After the step S120, the first program operation may be performed. In the first program operation, a program voltage Vpgm may be applied at the same time to at least two selected word lines among the word lines WL0 to WLn coupled to the plurality of memory cells of the memory cell array 110 (at S130).

After the step S130, if it is determined that with regard to each of the plurality of memory strings ST1 to STm at least one of the selected memory cells coupled to the selected word lines has been programmed (i.e., at least one of the selected memory cells coupled to the selected word lines has passed its program verification), it may be determined that all the memory cells of the memory string including the programmed memory cell have passed their program verifications (at S140), and a program inhibit voltage may be applied to the bit line of the memory string. If there is no memory string that has passed a program verification, another program voltage Vpgm increased by a step voltage may be applied to the selected word lines (at S150).

If all the memory strings ST1 to STm have passed their program verifications, the first program operation is completed (at S160). If there is any memory string that has not passed its program verification, the steps S130, S140 and S150 are repeatedly performed.

After the first program operation has been completed, the second program operation may be performed. In the second program operation, a program voltage Vpgm may be applied to each of the selected word lines one at a time in a predetermined order. That is, the second program operation of successively programming the plurality of pages corresponding to the selected word lines is performed. Here, a start program voltage Pgm Start Bias that is a program voltage first applied to the selected word lines during the first program operation may be applied as a start program voltage Pgm Start Bias of the second program operation (at S170).

The second program operation may be performed on a page basis. If all memory cells coupled to a selected word line have been programmed, a subsequent page may be selected, and then a program operation may be performed on the subsequent page. When the program operation for the selected pages is completed, the second program operation is completed (at S180).

During the second program operation, in the program operation for each page, if at least one among the memory cells included in a selected page is not programmed, the program voltage Vpgm may be increased stepwise (i.e., ISPP) and the increasing program voltages Vpgm may be applied to a selected word line (at S190).

Figure 4:
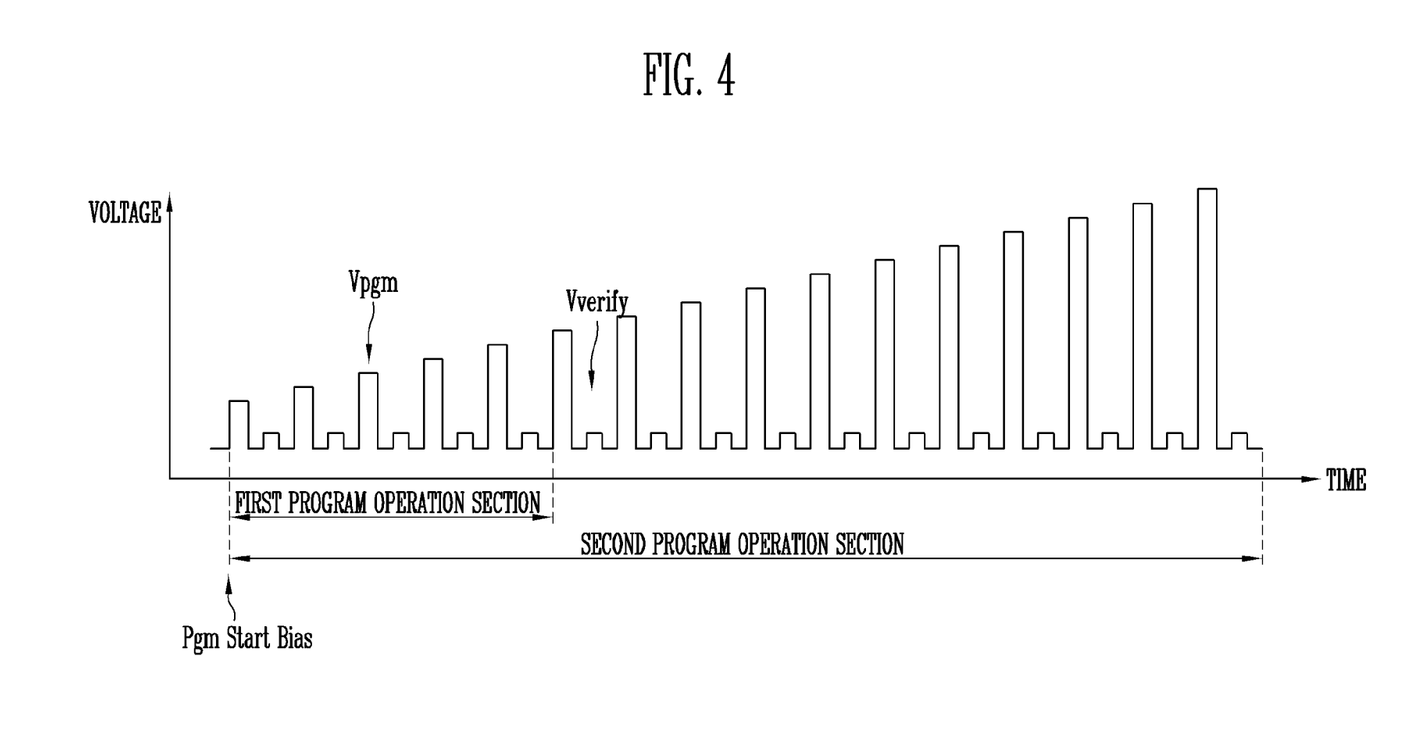
FIG. 4 is a diagram illustrating voltage levels of program pulses applied to selected word lines according to an embodiment of the present disclosure.

FIG. 4 is a diagram illustrating the voltage levels of program pulses applied to the selected word lines according to an embodiment of the present disclosure.

In an embodiment, the program operation may be performed on the MLC that stores two bits of data in a unit cell.

Referring to FIG. 4, the program operation may be performed using the ISPP, and thus the program voltage Vpgm may be increased stepwise from the start program voltage Pgm Start Bias by a step voltage. A verification voltage Vverify may be applied in a period of time between points in time when respective program voltages Vpgm are applied.

According to an embodiment, the start program voltage Pgm Start Bias of the first program operation period and the start program voltage Pgm Start Bias of the second program operation period may be set such to be the same as each other.

For example, during the first program operation, a program voltage Vpgm may be applied at the same time to at least two selected word lines of the plurality of word lines of the memory cell array. The start program voltage Pgm Start Bias of the first program operation may be set to 15V that is set at the initial stage. After the first program operation has been completed, the second program operation may be performed. In the second program operation, a program voltage Vpgm may be applied to each of the selected word lines, which were selected during the first program operation, one at a time in a predetermined order. The start program voltage Pgm Start Bias of the second program operation may be set to 15V that is the start program voltage Pgm Start Bias of the first program operation.

Figure 5:
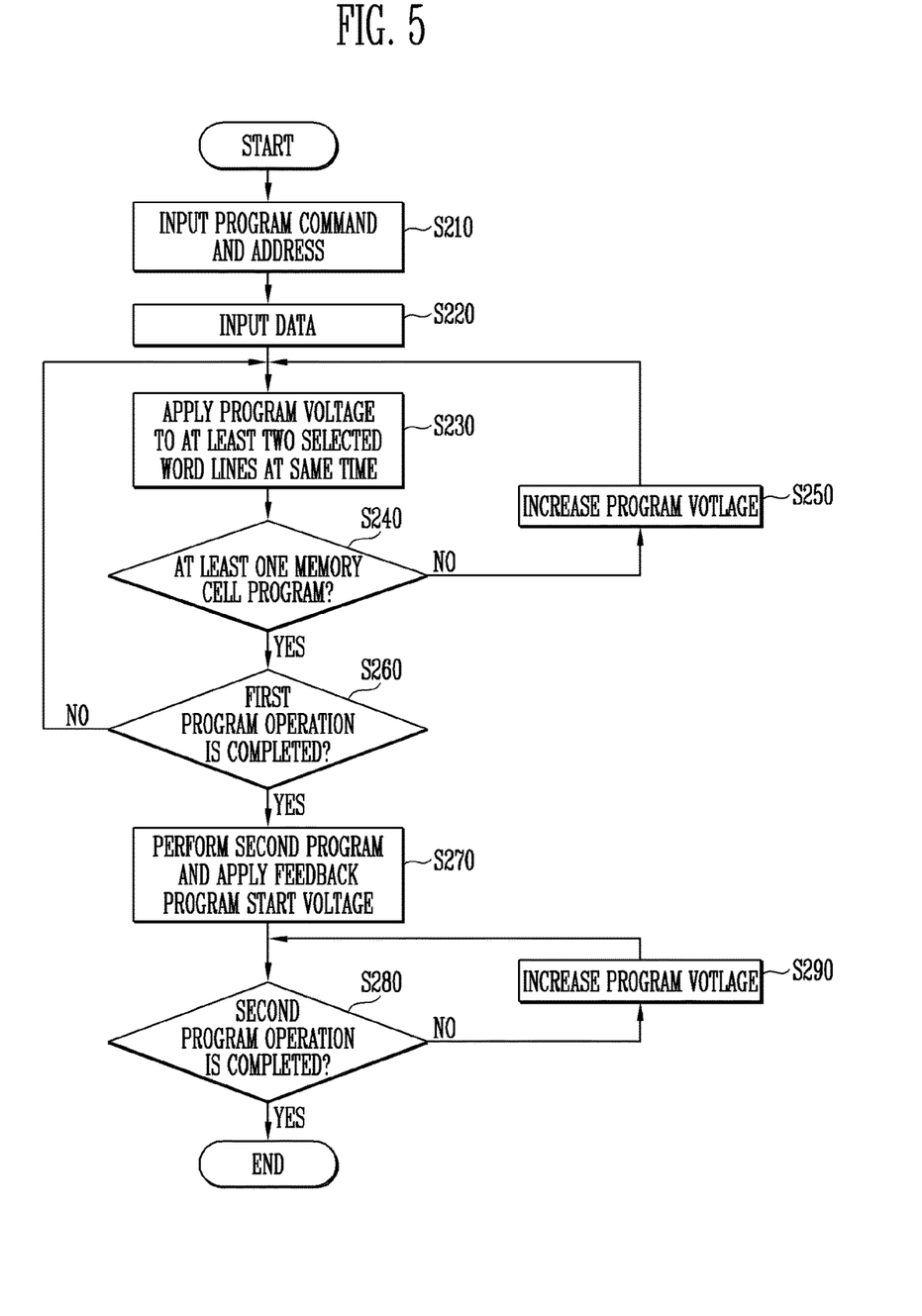
FIG. 5 is a flowchart illustrating an example of a program operation of a semiconductor memory device according to an embodiment of the present disclosure.

FIG. 5 is a flowchart illustrating an example of a program operation of a semiconductor memory device according to an embodiment of the present disclosure.

Referring to FIGS. 1, 2 and 5, a program command and address information may be input from an external device (at S210). A plurality of data bits DATA to be programmed may be input to the page buffers PB1 to PBm of the page buffer circuit 130 (at S220). Depending on the data bits DATA input to the page buffers PB1 to PBm, potential levels of the bit lines BL1 to BLm coupled to the memory cell array 110 may be controlled.

After the step S220, the first program operation may be performed. In the first program operation, a program voltage Vpgm may be applied at the same time to at least two selected word lines among the word lines WL0 to WLn coupled to the plurality of memory cells of the memory cell array 110 (at step S230).

After the step S130, if it is determined that with regard to each of the plurality of memory strings ST1 to STm at least one of the selected memory cells coupled to the selected word lines has been programmed (i.e., at least one of the selected memory cells coupled to the selected word lines has passed its program verification), it may be determined that all the memory cells of the memory string including the programmed memory cell have passed their program verifications (at S240), and then a program inhibit voltage may be applied to the bit line of the memory string. If it is determined that each memory string has not passed a program verification, another program voltage Vpgm increased by a step voltage may be applied to the selected word lines (at S250).

If it is determined that all the memory strings ST1 to STm have passed their program verifications, the first program operation is completed (at S260). If there is any memory string that has not passed its program verification, the steps S230, S240 and S250 are repeatedly performed.

After the first program operation has been completed, the second program operation may be performed. In the second program operation, a program voltage Vpgm may be applied to each of the selected word lines one at a time in a predetermined order. That is, the second program operation of successively programming the plurality of pages corresponding to the selected word lines is performed. Here, the last program voltage Vpgm applied during the first program operation to the selected word lines may be applied as a start program voltage Pgm Start Bias of the second program operation (at S270).

Alternatively, a voltage level increased by a step voltage from the last program voltage Vpgm of the first program operation may be set as the start program voltage Pgm Start Bias of the second program operation.

The second program operation may be performed on a page basis. If all memory cells coupled to a selected word line have been programmed, a subsequent page may be selected, and then a program operation may be performed on the subsequent page. When the program operation for the selected pages is completed, the second program operation is completed (at S280).

During the second program operation, in the program operation for each page, if at least one memory cell among the memory cells included in a page selected is not programmed, the program voltage Vpgm may be increased stepwise (i.e., ISPP) and the increasing program voltages Vpgm may be applied to a selected word line (at S290).

Figure 6:
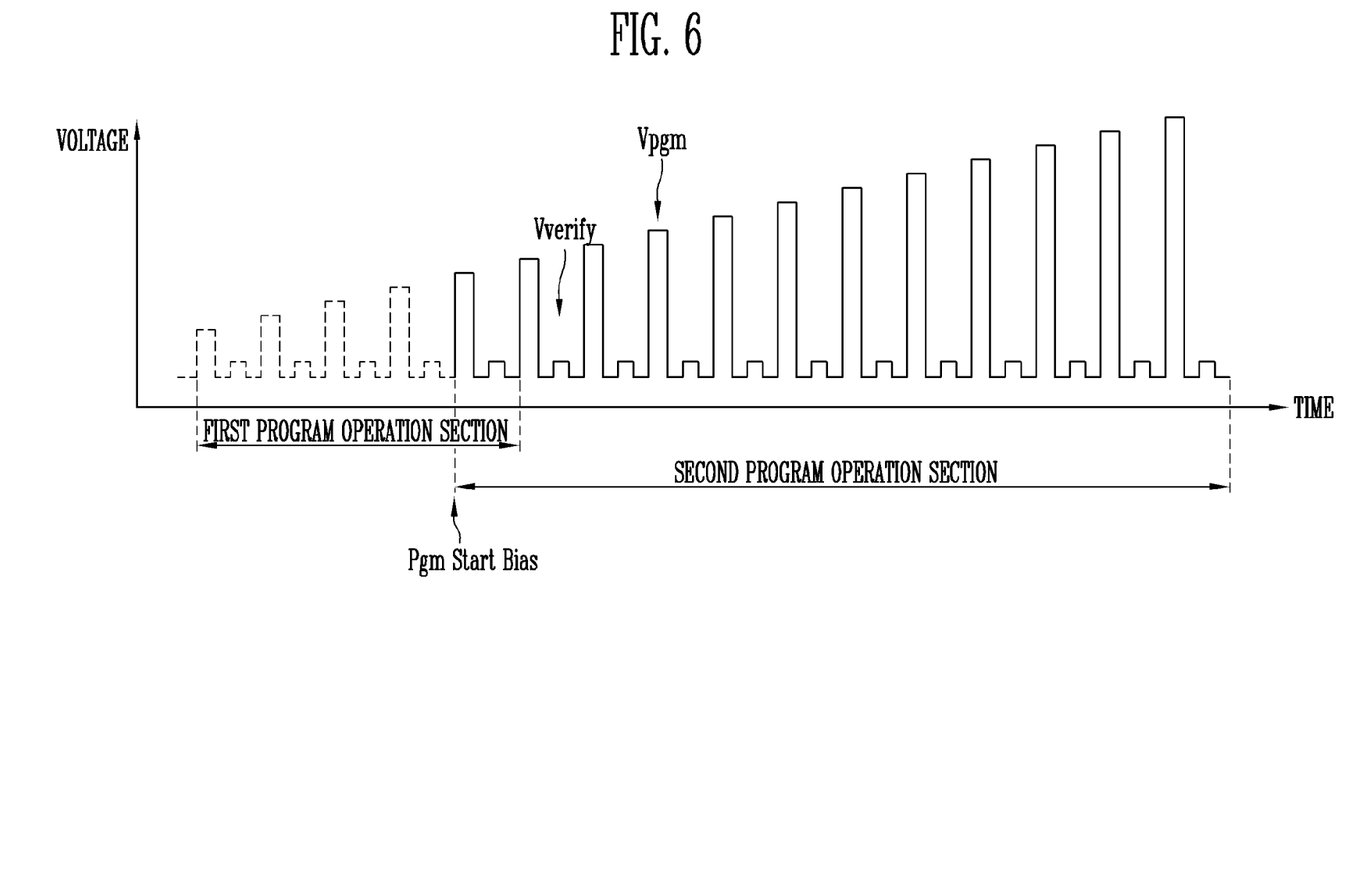
FIG. 6 is a diagram illustrating voltage levels of program pulses applied to selected word lines according to an embodiment of the present disclosure.

FIG. 6 is a diagram illustrating the voltage levels of program pulses applied to the selected word lines according to an embodiment of the present disclosure.

In an embodiment, the program operation may be performed on the MLC that stores two bits of data in a unit cell.

Referring to FIG. 6, the program operation may be performed using the ISPP, and thus the program voltage Vpgm may be increased stepwise from the start program voltage Pgm Start Bias by a step voltage. A verification voltage Vverify may be applied in a period of time between points in time when respective program voltages Vpgm are applied.

According to an embodiment, the last program voltage of the first program operation period may be set as the start program voltage Pgm Start Bias of the second program operation.

For example, during the first program operation, a program voltage Vpgm may be applied at the same time to at least two selected word lines of the plurality of word lines of the memory cell array, and the last program voltage Vpgm applied when the first program operation is completed may be 16V. After the first program operation has been completed, the second program operation may be performed. In the second program operation, a program voltage Vpgm may be applied to each of the selected word lines, which were selected during the first program operation, one at a time in a predetermined order. The start program voltage Pgm Start Bias of the second program operation may be set to 16V that is the last program voltage of the first program operation, which is applied when the first program operation is completed.

While the spirit and scope of the present disclosure are described by embodiments, it should be noted that the above-described embodiments are merely descriptive and should not be considered limiting. Further, it should be understood by those skilled in the art that various changes, substitutions, and alternations may be made herein without departing from the scope of the disclosure as defined by the following claims.

Figure 7:
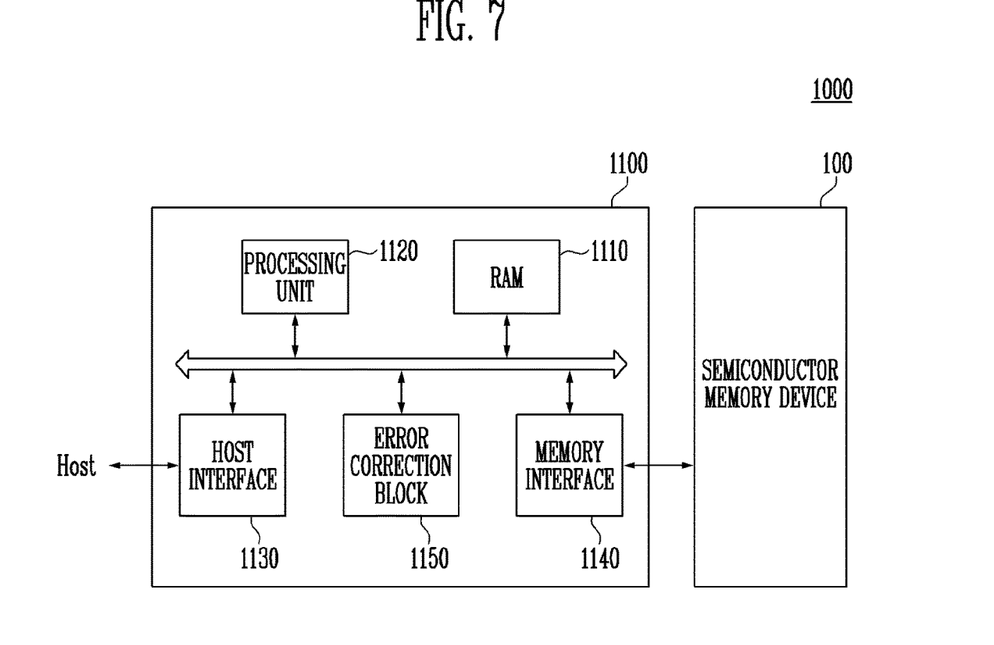
FIG. 7 is a diagram illustrating an example of a memory system including the semiconductor memory device of FIG. 1.

FIG. 7 is a diagram illustrating an example of a memory system including the semiconductor memory device of FIG. 1.

Referring FIG. 7, the memory system 1000 may include a semiconductor memory device 100 and a controller 1100.

Configurations and operations of the semiconductor memory device 100 may be the same as those of the semiconductor memory device described with reference to FIG. 1, and thus any repetitive detailed description will be omitted or simplified.

The controller 1100 may be coupled to a host Host and the semiconductor memory device 100. In response to a request from the host Host, the controller 1100 may access the semiconductor memory device 100. For example, the controller 1100 controls read, write, erase, and background operations of the semiconductor memory device 100. The controller 1100 may provide an interface between the host and the semiconductor memory device 100. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as at least one of an operation memory of the processing unit 1120, a cache memory between the semiconductor memory device 100 and the host, and a buffer memory between the semiconductor memory device 100 and the host. The processing unit 1120 may control the overall operation of the controller 1100. In addition, the controller 1100 may temporarily store program data provided from the host Host during the write operation.

The host interface 1130 may include a protocol for performing data exchange between the host Host and the controller 1100. In an embodiment, the controller 1200 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 may interface with the semiconductor memory device 100. For example, the memory interface may include a NAND interface or NOR interface.

The error correction block 1150 may use an error correction code (ECC) to detect and correct an error in data received from the semiconductor memory device 100. In an embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a memory card. For example, the controller 1100 and the semiconductor memory device 100 may be integrated into a memory card such as a personal computer memory card international association (e.g., PCMCIA), a compact flash card (CF), a smart media card (e.g., SM or SMC), a memory stick multimedia card (e.g., MMC, RS-MMC, or MMCmicro), a SD card (e.g., SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various types of packages. For example, Examples of the packages may include Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 8:
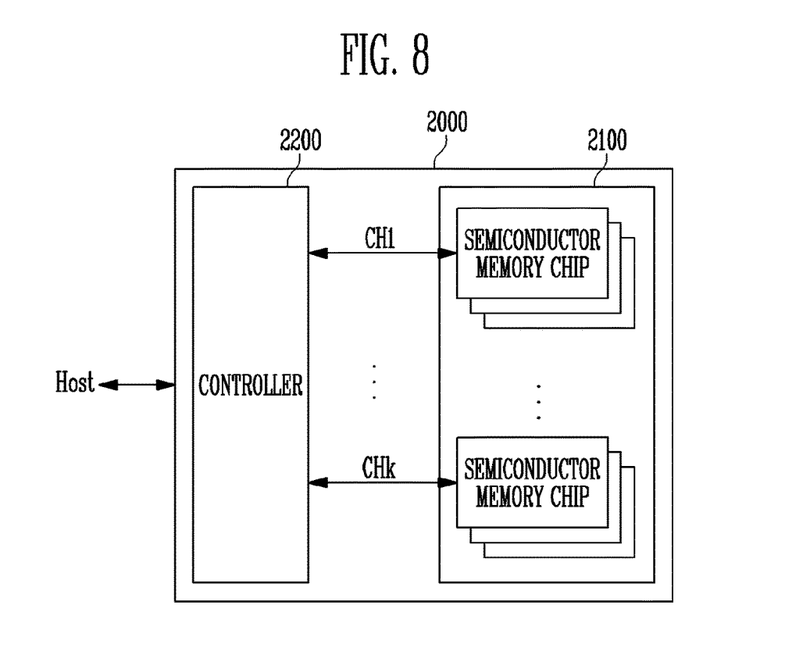
FIG. 8 is a diagram illustrating an application example of the memory system of FIG. 7.

FIG. 8 is a diagram illustrating an application example of the memory system of FIG. 7.

Referring FIG. 8, the memory system 2000 may include a semiconductor memory device 2100 and a controller 2200. The semiconductor memory device 2100 may include a plurality of memory chips. The semiconductor memory chips may be divided into a plurality of groups.

In FIG. 8, it is illustrated that each of the plurality of groups communicates with the controller 2200 through first to k-th channels CH1 to CHk. Each semiconductor memory chip may operate in the same manner as that of an embodiment of the semiconductor memory device 100 described with reference to FIG. 1.

Each group may communicate with the controller 2200 through one common channel. The controller 2200 may have the same configuration as that of the controller 1100 described with reference to FIG. 8, and may control a plurality of memory chips of the semiconductor memory device 2100 through the plurality of channels CH1 to CHk.

Figure 9:
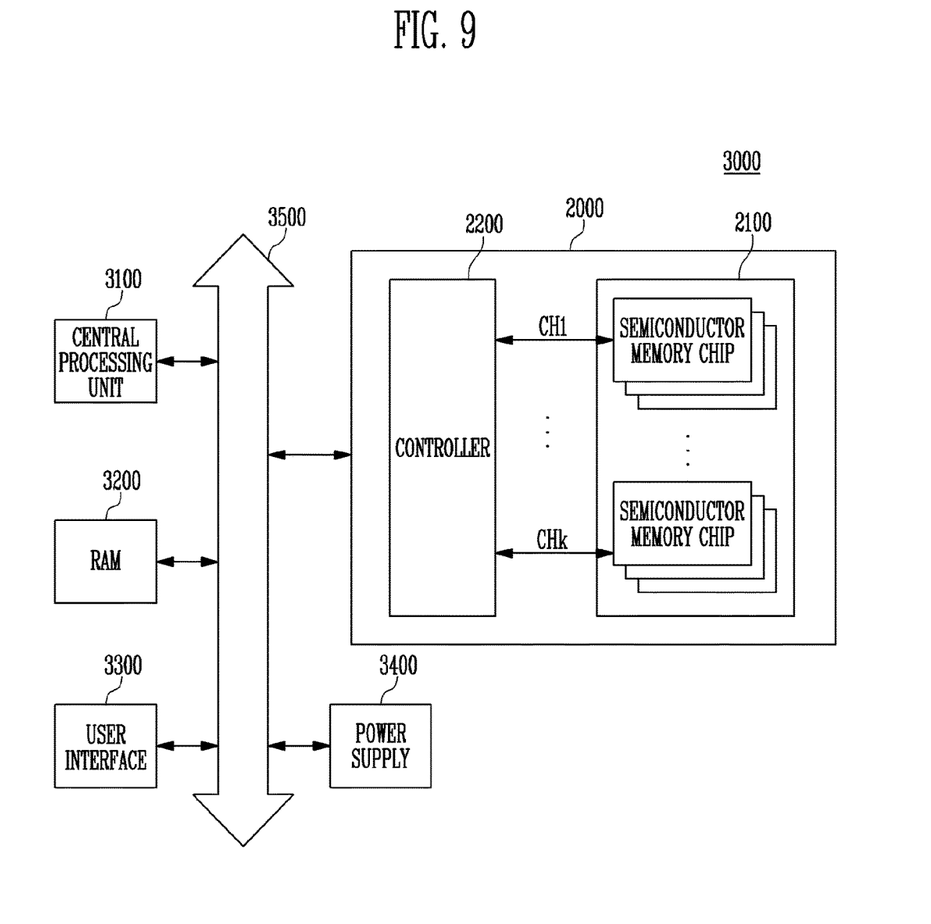
FIG. 9 is a diagram illustrating an example of a computing system including the memory system illustrated with reference to FIG. 8.

FIG. 9 is a diagram illustrating an example of a computing system including the memory system illustrated with reference to FIG. 8.

Referring to FIG. 9, the computing system 3000 may include a central processing unit 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 9, the semiconductor memory device 2100 is illustrated as being coupled to the system bus 3500 through the controller 2200. However, the semiconductor memory device 2100 may be directly connected to the system bus 3500. The function of the controller 2200 may be performed by the CPU 3100 and the RAM 3200.

In FIG. 9, the memory system 2000 described with reference to FIG. 8 is illustrated as being provided. However, the memory system 2000 may be replaced with the memory system 1000 described with reference to FIG. 7. In an embodiment, the computing system 3000 may include all the memory systems 1000 and 2000 described with reference to FIGS. 7 and 8.

According to an embodiment of the present disclosure, a program voltage is applied to a plurality of word lines at the same time, and then a program voltage is successively applied to each of the selected word lines. Therefore, the number of iterations of program pulse applications needed to complete the program operations may be reduced, and thus the time it takes to perform the program operation may decrease.

While embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A semiconductor memory device comprising:
a memory cell array including a plurality of memory strings;
peripheral circuits configured to program the memory cell array; and
a control logic configured to control the peripheral circuits and execute instructions for:
performing a first program operation by applying a program voltage to at least two selected word lines, among a plurality of word lines of the memory cell array, at a same time; and
after the first program operation, performing a second program operation by applying the program voltage to each of the selected word lines one at a time.

2. The semiconductor memory device according to claim 1, wherein the control logic controls the peripheral circuits such that, for each of the plurality of memory strings, when at least one of selected memory cells coupled to the selected word lines is programmed, it is determined that the corresponding memory string has passed a program verification.

3. The semiconductor memory device according to claim 2, wherein the control logic controls the peripheral circuits such that if it is determined that all the memory strings have passed their program verifications, the first program operation is completed.

4. The semiconductor memory device according to claim 2, wherein the control logic controls the peripheral circuits such that a program inhibit voltage is applied to a bit line of the memory string that has passed a program verification.

5. The semiconductor memory device according to claim 1, wherein the first program operation is performed using an incremental step pulse program (ISPP).

6. The semiconductor memory device according to claim 5, wherein the control logic controls the peripheral circuits by setting a last program voltage of the first program operation as a start program voltage of the second program operation or setting a voltage level increased by a step voltage from the last program voltage of the first program operation as the start program voltage of the second program operation.

7. The semiconductor memory device according to claim 5, wherein the control logic controls the peripheral circuits such that a start program voltage of the first program operation and a start program voltage of the second program operation are equal to each other.

8. A semiconductor memory device comprising:
a memory cell array including a plurality of memory strings;
peripheral circuits configured to program the memory cell array; and
a control logic configured to control the peripheral circuits so as to perform a first program operation by applying a program voltage to at least two selected word lines, among a plurality of word lines of the memory cell array, at a same time, and, after the first program operation, perform a second program operation by applying the program voltage to each of the selected word lines one at a time, wherein the peripheral circuits are controlled such that a start program voltage of the second program operation is set using a last program voltage of the first program operation.

9. The semiconductor memory device according to claim 8, wherein the control logic controls the peripheral circuits such that, for each of the plurality of memory strings, when at least one of selected memory cells coupled to the selected word lines is programmed, it is determined that the corresponding memory string has passed a program verification.

10. The semiconductor memory device according to claim 9, wherein the control logic controls the peripheral circuits such that if it is determined that all the memory strings have passed their program verifications, the first program operation is completed.

11. The semiconductor memory device according to claim 9, wherein the control logic controls the peripheral circuits such that a program inhibit voltage is applied to a bit line of the memory string that has passed a program verification.

12. The semiconductor memory device according to claim 8, wherein the first program operation is performed using an incremental step pulse program (ISPP).

13. The semiconductor memory device according to claim 12, wherein the control logic controls the peripheral circuits by setting a last program voltage of the first program operation as a start program voltage of the second program operation or setting a voltage level increased by a step voltage from the last program voltage of the first program operation as the start program voltage of the second program operation.

14. A method of operating a semiconductor memory device, comprising:
   storing a plurality of data bits in page buffers coupled to a memory cell array through bit lines, the memory cell array including a plurality of memory strings;
   adjusting a potential level of the bit lines depending on the plurality of data bits;
   performing a first program operation by simultaneously applying a program voltage to at least two selected word lines of a plurality of word lines of the memory cell array; and
   performing, after the first program operation, a second program operation by applying the program voltage to each of the selected word lines one at a time.

15. The method according to claim 14, further comprising:
   if for each of the plurality of memory strings at least one of selected memory cells coupled to the selected word lines is programmed, determining that the corresponding memory string has passed a program verification, and, if the corresponding memory string has not passed the program verification, applying a new program voltage increased by a step voltage to the selected word lines.

16. The method according to claim 15, further comprising completing the first program operation if it is determined that all the memory strings have passed their program verifications.

17. The method according to claim 15, further comprising applying a program inhibit voltage to a bit line of the memory string that has passed the program verification.

18. The method according to claim 14, wherein the first program operation is performed using an incremental step pulse program (ISPP), the method further comprising setting a last program voltage of the first program operation as a start program voltage of the second program operation.

19. The method according to claim 14, wherein the start program voltage of the second program operation is a voltage obtained by adding a step voltage to the last program voltage of the first program operation.

20. The method according to claim 14, wherein the first program operation is performed using an incremental step pulse program (ISPP), the method further comprising setting a start program voltage of the first program operation and a start program voltage of the second program operation as being equal to each other.

* * * * *